US006768356B1

(12) United States Patent
Wu et al.

(10) Patent No.: US 6,768,356 B1
(45) Date of Patent: Jul. 27, 2004

(54) APPARATUS FOR AND METHOD OF IMPLEMENTING TIME-INTERLEAVED ARCHITECTURE

(75) Inventors: Lin Wu, Ames, IA (US); William C. Black, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 0 days.

(21) Appl. No.: 09/656,763

(22) Filed: Sep. 7, 2000

(51) Int. Cl.[7] ............................................... H03L 7/06
(52) U.S. Cl. ...................... 327/156; 327/158; 327/245; 327/251
(58) Field of Search ................................. 327/156, 158, 327/159, 161, 152–154, 295, 243–245, 250–253, 258, 291; 331/50, 51

(56) References Cited

U.S. PATENT DOCUMENTS

| | | | |
|---|---|---|---|
| 5,073,730 A | * 12/1991 | Hoffman | 326/86 |
| 5,146,121 A | * 9/1992 | Searles et al. | 327/276 |
| 5,295,164 A | * 3/1994 | Yamamura | 375/120 |
| 5,302,920 A | * 4/1994 | Bitting | 331/45 |
| 5,331,295 A | * 7/1994 | Jelinek et al. | 331/57 |
| 5,448,191 A | * 9/1995 | Meyer | 327/105 |
| 5,451,911 A | * 9/1995 | Colvin et al. | 331/57 |
| 5,561,692 A | * 10/1996 | Maitland et al. | 375/371 |
| 5,563,554 A | * 10/1996 | Mizuno | 331/57 |
| 5,619,170 A | * 4/1997 | Nakamura | 331/1 A |
| 5,668,504 A | * 9/1997 | Rodriques Ramalho | 331/1 A |
| 5,686,850 A | * 11/1997 | Takaki et al. | 327/261 |
| 5,838,178 A | * 11/1998 | Marbot | 327/116 |
| 5,889,436 A | * 3/1999 | Yeung et al. | 331/2 |
| 6,026,134 A | * 2/2000 | Duffy et al. | 375/376 |
| 6,037,812 A | * 3/2000 | Gaudet | 327/116 |
| 6,043,718 A | * 3/2000 | Diniz et al. | 331/57 |
| 6,087,868 A | * 7/2000 | Millar | 327/156 |
| 6,137,336 A | * 10/2000 | Baba et al. | 327/295 |

OTHER PUBLICATIONS

John G. Maneatis, "Low–Jitter Process–Independent DLL and PLL Based on Self–Biased Techniques", *IEEE Journal of Solid–State Circuits*, vol. 31, No. 11, Nov. 1996, pp. 1723–1732.

Chan–Hong Park et al., "A Low–Noise, 900–MHz VCO in 0.6–µm CMOS", *IEEE Journal of Solid–State Circuits*, vol. 34, No. 5, May 1999, pp. 586–591.

Ali Hajimiri et al., "Jitter and Phase Noise in Ring Oscillators", *IEEE Journal of Solid–State Circuits*, vol. 34, No. 6, Jun. 1999, pp. 790–804.

Beomsup Kim et al., "PLL/DLL System Noise Analysis for Low Jitter Clock Synthesizer Design", *Department of Electrical Engineering and Computer Sciences, University of California, Berkley / Department of Electrical Engineering, Korea Advanced Institute of Science and Technology*, pp. 31–34.

(List continued on next page.)

*Primary Examiner*—Timothy P. Callahan
*Assistant Examiner*—Hai L Nguyen
(74) *Attorney, Agent, or Firm*—Dickstein Shapiro Morin & Oshinsky LLP (57) ABSTRACT

In accordance with a preferred embodiment, a time-interleaved (or multi-phase) architecture is provided having individual control of a plurality of output signals or phases. The time-interleaved architecture may be implemented using a first set of delay cells such as those in a ring oscillator or a delay line device receiving overall control of its output signals by a global control signal. The global control signal may be issued by a phase-locked loop, delay-locked loop, or other like structure. A second set of delay cells is provided to further delay the output signals produced by the first set of delay cells. The second set of delay cells are controlled by individual control signals uniquely calibrated in accordance with a preferred embodiment of the invention to provide uniform (or substantially) uniform time spacing between output signals.

25 Claims, 6 Drawing Sheets

OTHER PUBLICATIONS

John A. McNeill, "Jitter in Ring Oscillators", *IEEE Journal of Solid–State Circuits,* vol. 32, No. 6, Jun. 1997, pp. 870–879.

Behzad Razavi, "A Study of Phase Noise in CMOS Oscillators", *IEEE Journal of Solid–State Circuits,* vol. 31, No. 3, Mar. 1996, pp. 331–343.

Richard Gu et al., "A 0.5–3.5Gb/s Low–Power Low–Jitter Serial Data CMOS Transceiver", *1999 IEEE International Solid–State Circuits Conference,* ISSCC99/Session 20/Paper WA 20.4, pp. 352–353 and 478.

Joonsuk Lee et al., "A 250MHz Low Jitter Adaptive Bandwidth PLL", *1999 IEEE International Solid–State Circuits Conference,* ISSCC99/Session 20/Paper WA 20.1, pp. 346346–346347 and 477.

David W. Boerstler, "A Low–Jitter PLL Clock Generator for Microprocessors with Lock Range of 340–612 MHz", *IEEE Journal of Solid–State Circuits,* vol. 34, No. 4, Apr. 1999, pp. 513–519.

T. Saeki, et al., "A 1.3 cycle lock time, non PLL/DLL jitter suppression clock multiplier based on direct clock cycle interpolation for 'Clock on Demand'", *2000 IEEE International Solid–State Circuits Conference (2000),* p. 166–167.

I. Hwang, et al., "A digitally controlled phase–locked loop with fast locking scheme for clock synthesis application", *2000 IEEE International Solid–State Circuits Conference (2000),* p. 168–169.

\* cited by examiner

APPARATUS FOR AND METHOD OF IMPLEMENTING TIME-INTERLEAVED ARCHITECTURE

BACKGROUND

Figure 8A:
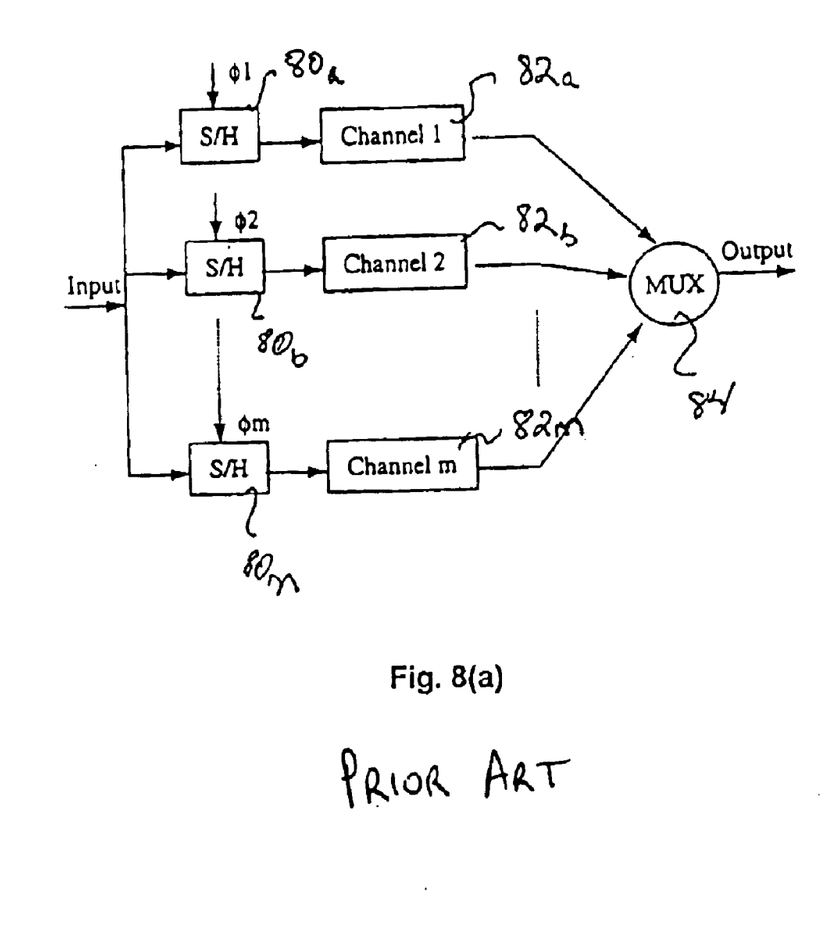
FIG. 8(a) is a block diagram illustrating a known time-interleaved architecture.

Time interleaved (or multi-channel) architecture is commonly used in semiconductor or other devices to provide parallelism in circuit design. As circuit speed, resolution and complexity are ever increasing, the demands on circuit design are immense. Time interleaved architecture assists in meeting these demands by providing a mechanism for relaxing the criteria without foregoing circuit performance. As shown in FIG. 8(a), for example, the time-interleaved architecture is typically composed of a plurality of parallel channel devices 82a, 82b, . . . 82m generating a plurality of channel output signals which are ultimately combined as a single output using a device such as multiplexer 84.

Many advantages arise from the use of such a time-interleaved architecture. For example, in a circuit design requiring a final speed of Fs, utilizing a time-interleaved architcture, a series of m channels (e.g., channels 1, 2, . . . m, as in FIG. 8 (a)) can be used. Where each channel is designed to perform the required functions in parallel, the individual channels need only be designed to perform at the less demanding speed of Fs/m. The circuit design on each individual channel therefore is relaxed and more manageable.

Figure 8B:
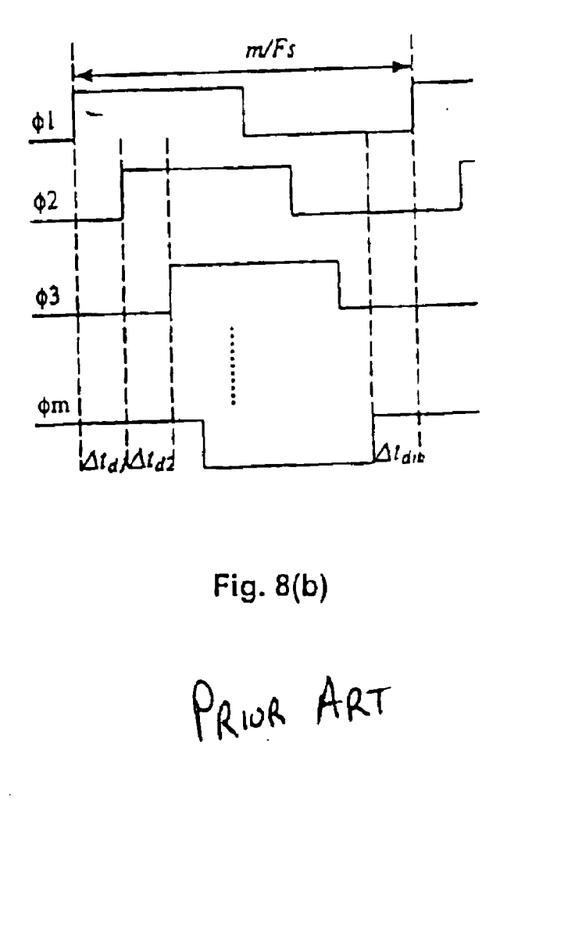
FIG. 8(b) is the ideal timing diagram for the known time-interleaved architecture illustrated in FIG. 8(a).

To successfully implement any time-interleaved architecture, a precise delay multi-phase clock generator is required. As shown in FIG. 8(a), a plurality of sample and hold devices 80a, 80b, . . . 80m must sample the input signals at precise intervals to provide the correct input signal samples to the plurality of channel devices 82a, 82b, . . . 82m. The multi-phase clock signals φ1, φ2, . . . φm must therefore be precise in the time intervals between clock phases. Ideally, the delay between any adjacent phases should be exactly the same, i.e., φ1, φ2, . . . uniformly distributed within one clock period m/Fs, $\Delta td_1 = \Delta td_2 = \ldots = \Delta td_m = 1/Fs$, as shown in FIG. 8(b).

In real-world applications, however, random variations of the sampling signals is unavoidable. The instability of every individual clock phase itself makes precise sampling difficult. The instability is often caused by noise sources (commonly known as "jitter") on the device itself (e.g., integrated circuit or "chip"). Jitter raises the noise floor, thus, reducing signal-to-noise ratio (SNR). Variations in the sampling signals may also be attributed to mismatches in the device, the channel, or both. Such mismatches may introduce tones into the operation, thereby reducing spurious-free dynamic range (SFDR). Such random variations in the sampling signals is often critical to the effectiveness of the time-interleaved architecture.

SUMMARY

In accordance with a preferred embodiment, a time-interleaved (or multi-phase) architecture is provided having individual control of a plurality of output signals or phases. The time-interleaved architecture may be implemented using a first set of delay cells such as those in a ring oscillator or a delay line device receiving overall control of its output signals by a global control signal. The global control signal may be issued by a phase-locked loop, delay-locked loop, or other like structure. A second set of delay cells is provided to further delay the output signals produced by the first set of delay cells. The second set of delay cells are controlled by individual control signals uniquely calibrated in accordance with a preferred embodiment of the invention to provide uniform (or substantially) uniform time spacing between output signals.

BRIEF DESCRIPTION OF THE DRAWINGS

Many advantages, features, and applications of the invention will be apparent from the following detailed description of preferred embodiments of the invention, which is provided in connection with the accompanying drawings, in which.

DETAILED DESCRIPTION

Preferred embodiments in application of the invention will now be described with reference to FIGS. 1–7. Other embodiments may be realized and structural or logical changes may be made to the disclosed embodiments without departing from the spirit or scope of the invention. Although the embodiments are particularly described as applied to a time-interleaved (or multi-channel) architecture in the form of a multi-phase clock, it should be readily apparent that the invention may be embodied in any device or system having the same or similar problems.

Figure 1:
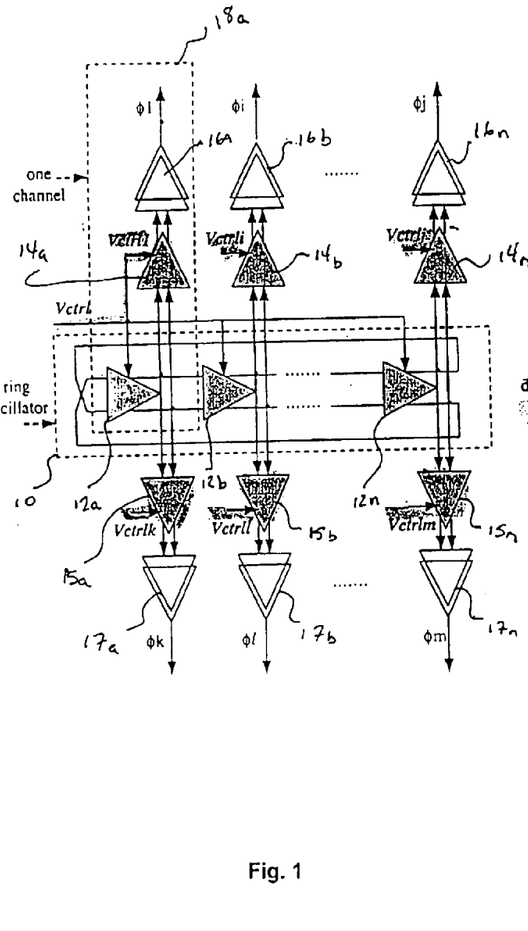
FIG. 1 is a block diagram illustrating a time-interleaved architecture implemented with a ring oscillator in accordance with a preferred embodiment of the invention.

In accordance with a preferred embodiment of the invention, a first set of delay cells 12a, 12b, . . . 12n are provided to produce a series of output signals, as shown in FIG. 1. In this illustrated embodiment, the first set of delay cells 12a, 12b, . . . 12n are presented in a series or cascade format and embodied in a ring oscillator 10, which is part of a time-interleaved architecture such as a multi-phase clock generator. Other configurations, implementations and applications of the invention, however, should be readily apparent to those skilled in the art. A global control signal (control voltage Vctrl) is commonly connected to the control inputs of each of the first set of delay cells 12a, 12b, . . . 12n in a manner well known in the art. Typically, such a global control signal is output from a feedback control loop (e.g., phase-locked loop (PLL), or other equivalent circuit) (not shown in FIG. 1) so as to control the general timing of output signals produced by delay cells 12a, 12b, . . . 12n in a manner well known in the art.

As illustrated, the output signals produced by delay cells 12a, 12b, . . . 12n are received by a second set of delay cells 14a, 14b, . . . 14n, 15a, 15b, . . . 15n. The second set of delay cells may take any known form, and are typically the same structures used in the first set of delay cells 12a, 12b, . . . 12n. Like the first set of delay cells, the second set of delay cells 14a, 14b, . . . 14n, 15a, 15b, . . . 15n generate delayed output signals in response to the signals received at their inputs. Unlike the first set of delay cells, however, the second set of delay cells do not utilize a global control signal to control the timing of their delayed outputs. Instead, the second set of delay cells 14a, 14b, . . . 14n, 15a, 15b, . . . 15n receive as inputs a series of individual control signals Vctrl1, Vctrli, . . . Vctrlj, Vctrlk, Vctrll, . . . Vctrlm that provide the ability to individually control each delay cell 14a, 14b, . . . 14n, 15a, 15b, . . . 15nindependently of the other. The individual control signals preferably provide a mechanism for compensating for any delay mismatch in the time-interleaved architecture so as to provide uniform (or at least substantially uniform) time intervals between output phases, as well as providing a mechanism for individually controlling the output phases for any purpose desired, including non-identical pulse widths or other individual output phase control.

In the illustrated embodiment, the series of individual control signals adjust the time intervals of (or time spacing between) respective output signals issued by ring oscillator 10 without affecting any global loop control provided by global control signal Vctrl. Indeed, in this illustrated embodiment, one channel 18a of the time-interleaved architecture is directly aligned with global control signal Vctrl by tapping the global control signal Vctrl as the input control signal for its second series delay cell 14a, as shown in FIG. 1.

For the illustrated embodiment, a channel output signal φ1, φi, . . . φj, φk, φl, . . . φm, is provided for each channel (e.g., only one channel 18a is specifically illustrated) by a respective output buffer 16a, 16b, . . . 16n, 17a, 17b, . . . 17n. Output buffers may be useful in a variety of applications such as, for example, where the output signal is a clock phase needed to drive internal circuitry of an (on-chip) integrated electronic system.

Figure 2:
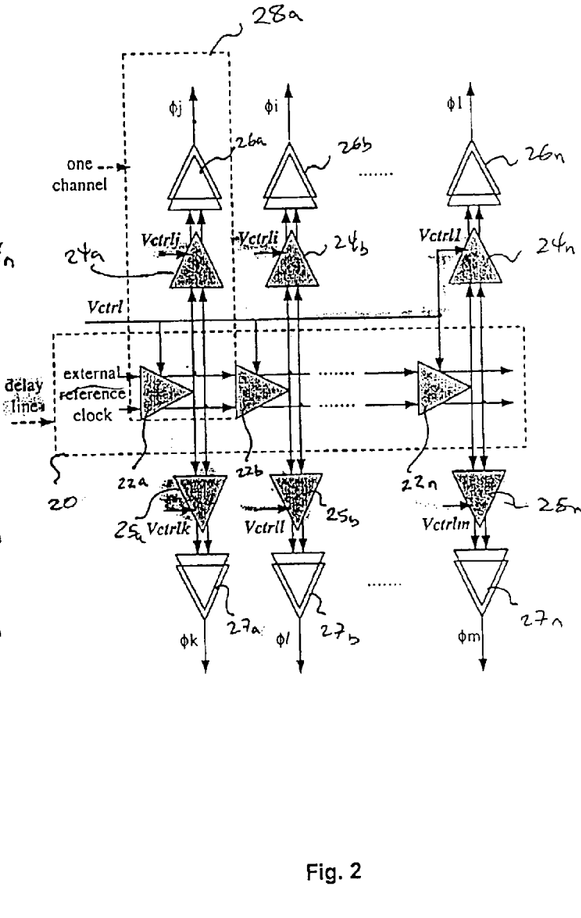
FIG. 2 is a block diagram illustrating a time-interleaved architecture implemented with a delay line in accordance with a preferred embodiment of the invention.

FIG. 2 illustrates a preferred embodiment of the invention employing a first set of delay cells 22a, 22b, . . . 22n in the form of delay line 20. The structure (and operation) of this embodiment is substantially similar to that described above with respect to FIG. 1. A second set of delay cells 24a, 24b, . . . 24n, 25a, 25b, . . . 25n receive output signals produced by the first set of delay cells 22a, 22b, . . . 22n to, in turn, produce delayed output signals to be relayed to output buffers 26a, 26b, . . . 26n, 27a, 27b, . . . 27n. A series of individual control signals Vctrl1, Vctrli, . . . Vctrlj, Vctrlk, Vctrll, . . . Vctrlm is provided for the individual control of delay cells 24a, 24b, . . . 24n, 25a, 25b, . . . 25n, respectively. This series of individual control signals uniquely offers fine adjustment control for each one of the second set of delay cells in addition to the overall control provided by global control signal Vctrl.

Preferably, at least one individual control signal (e.g., Vctrl1) is aligned with global control signal Vctrl, as shown in FIG. 2. Unlike the initial delay cell 12a in the first set of delay cells 12a, 12b, . . . 12n making up the ring oscillator 10 in FIG. 1, the initial delay cell 22a of the second set of delay cells 22a, 22b, . . . 22n making up delay line 20 in FIG. 2 does not receive as its input a feedback signal from a downstream delay cell. Instead, the initial delay cell 22a receives as its input an external reference clock signal in this illustrated embodiment. Channel output signals φ1, φi, . . . φj, φk, φl . . . φm are provided for each channel (e.g., only one channel 28a is specifically illustrated) by respective output buffers 26a, 26b, . . . 26n, 27a, 27b, . . . 27n.

Figure 3:
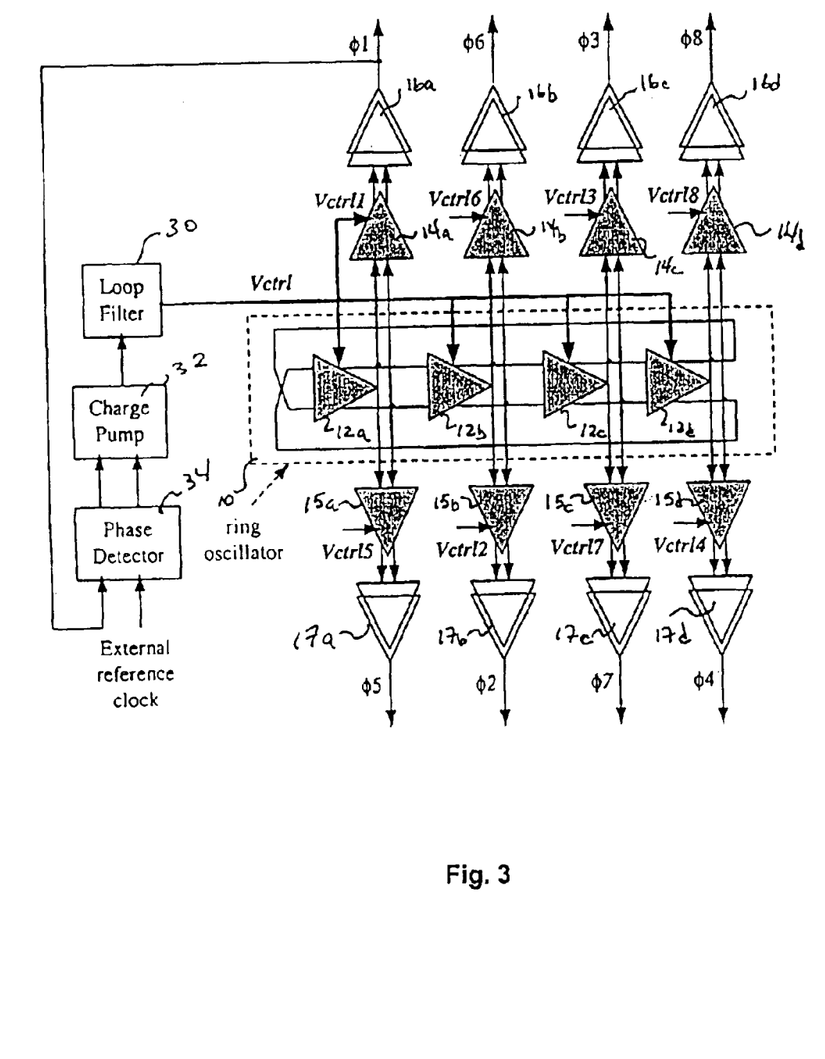
FIG. 3 is a block diagram illustrating a time-interleaved architecture implemented with a phase-locked loop (PLL) in accordance with a preferred embodiment of the invention.

The time-interleaved architectures depicted in FIGS. 1 and 2 can easily be applied to a variety of applications. A phase-locked loop (PLL)-based multi-phase clock generator system may be formed, for example, with the addition of loop filter 30, charge pump 32, and phase detector 34, as shown in FIG. 3. Phase detector 34 receives both an external reference clock signal and one (e.g., φ1) of the plurality of channel output signals φ1, φ2, φ3, φ4, φ5, φ6, φ7, φ8 provided by a respective one (e.g., 16a) of the plurality of output buffers 16a, 16b, 16c, 16d, 17a, 17b, 17c, 17d. Phase detector 34 outputs a directional control signal based on a comparison of output phases of the reference clock signal and one (e.g., φ1) of the channel output signals so as to align the channel output signal with the reference clock signal. Charge pump 32 converts the directional control signal generated by phase detector 34 into an output current. Loop filter 30 provides a filtered main output control voltage in the form of global control signal Vctrl, which corresponds to the output current provided by charge pump 32.

The global control signal Vctrl is input to each of the first set of delay cells 12a, 12b, 12c, 12d to provide overall control of the delay cells. Output signals from the first set of delay cells are input to a second set of delay cells 14a, 14b, 14c, 14d, 15a, 15b, 15c, 15d. The second set of delay cells produces delayed output signals based on individual control signals Vctrl1, Vctrl2, Vctrl3, Vctrl4, Vctrl5, Vctrl6, Vctrl7, Vctrl8 input to the second set of delay cells. Because individual control signal Vctrl1 is tied to the output (Vctrl) of loop filter 30, individual control signal Vctrl1 can be made to be aligned with the external reference clock. Delayed output signals from the second set of delay cells 14a, 14b, 14c, 14d, 15a, 15b, 15c, 15d are provided to output buffers 16a, 16b, 16c, 16d, 17a, 17b, 17c, 17d, which, in turn, generate the plurality of channel output signals φ1, φ2, φ3, φ4, φ5, φ6, φ7, φ8.

Figure 4:
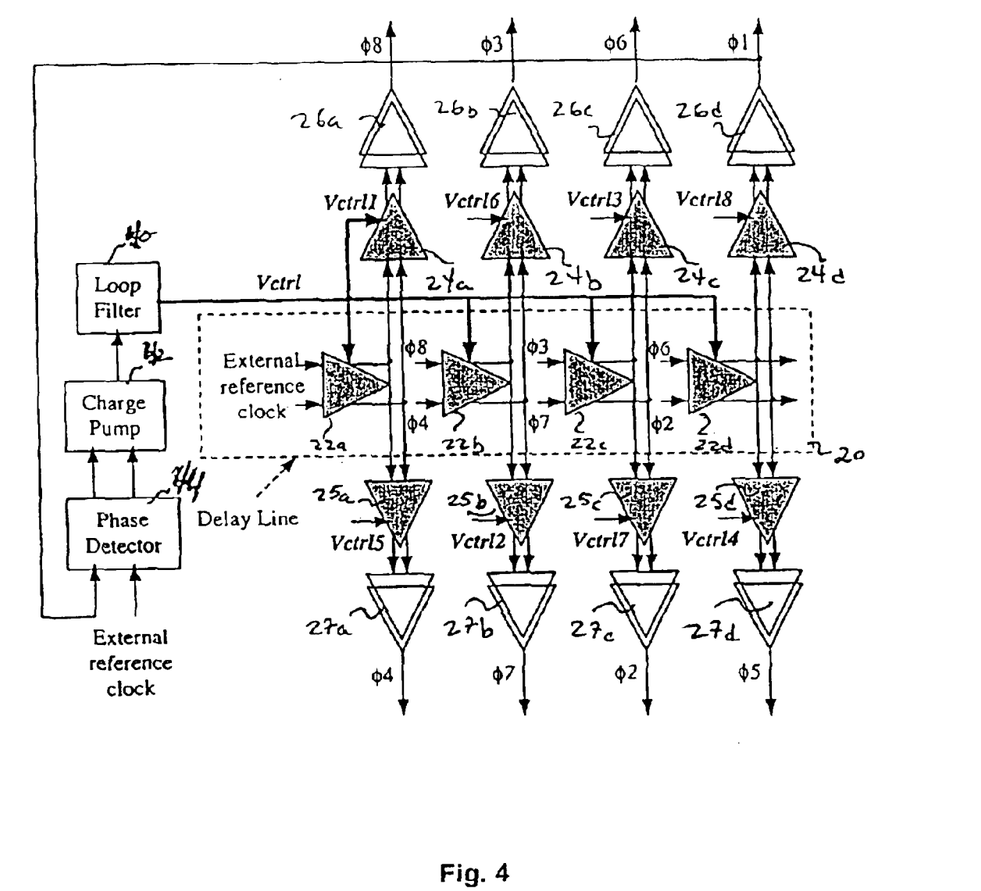
FIG. 4 is a block diagram illustrating a time-interleaved architecture implemented with a delay-locked loop (DLL) in accordance with a preferred embodiment of the invention.

A similar implementation of the time-interleaved architecture of FIG. 2 is made by adding loop filter 40, charge pump 42, and phase detector 44 to form a delay-locked loop (DLL)-based multi-phase clock generator system, as shown in FIG. 4. As with the system of FIG. 3, phase detector 44, charge pump 42, and loop filter 40 in this exemplary system cooperate to produce global control signal Vctrl based on a comparison of an external reference clock and one of the channel output signals φ1, φ2, φ3, φ4, φ5, φ6, φ7, φ8, generated by output buffers 26a, 26b, 26c, 26d, 27a, 27b, 27c, 27d. The use of first set of delay cells 22a, 22b, 22c, 22d and second set of delay cells 24a, 24b, 24c, 24d, 25a, 25b, 25c, 25d in conjunction with individual control signals Vctrl1, Vctrl2, Vctrl3, Vctrl4, Vctrl5, Vctrl6, Vctrl7, Vctrl8 produces a series of delayed output signals for use in generating channel output signals φ1, φ2, φ3, φ4, φ5, φ06, φ07, φ8 by output buffers 26a, 26b, 26c, 26d, 27a, 27b, 27c, 27d, in the manner described in detail above.

As should be readily apparent, a number of different mechanisms can be employed to generate the individual control signals Vctrl1, Vctrli, . . . Vctrlj, Vctrtk, Vctrl, . . . Vctrlm used in the time-interleaved architectures described herein. In accordance with a preferred embodiment of the invention, calibration loops are a provided to produce the individual control signals, as will be described in detail below in connection with an exemplary 8 channel (φ1, φ2, φ3, φ4, φ5, φ6, φ7, φ8) architecture. In the calibration loops, one phase (e.g., φ1) is aligned to the external reference clock used to provide global feedback control (e.g., using PLL, DLL, etc.) of the time-interleaved architecture. Accordingly, one of the individual control signals (e.g., Vctrl1) can be taken as the same control signal (e.g., Vctrl) generated by the global feedback loop. The remaining individual control signals Vctrl2, Vctrl3, Vctrl4, Vctrl5, Vctrl6, Vctrl7, Vctrl8 are generated in a bi-sected manner, in accordance with this exemplary embodiment described in detail below.

Figure 5:
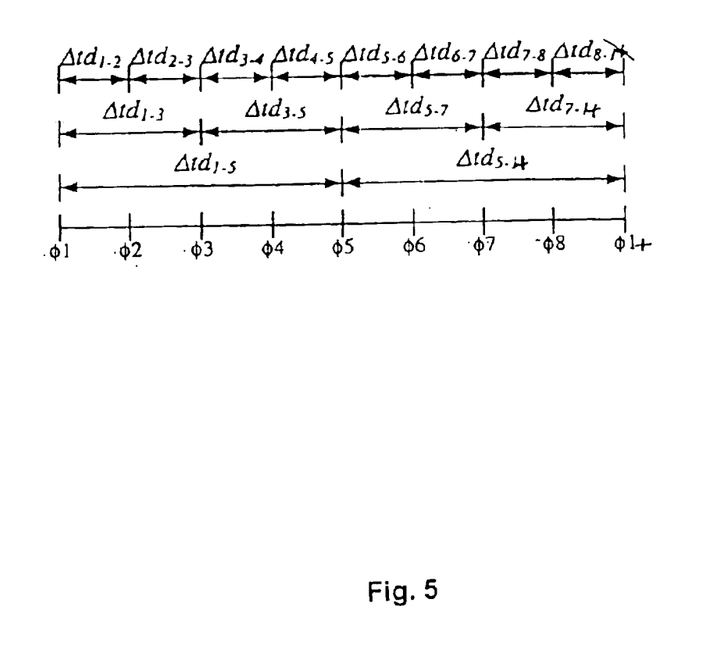
FIG. 5 is a timing diagram illustrating a calibration method in accordance with a preferred embodiment of the invention.

As shown in FIG. 5, the different channel output phases $\phi1, \phi2, \phi3, \phi4, \phi5, \phi6, \phi7, \phi8$, are spaced in time relative to each other, as represented by time intervals $\Delta td_{x-y}$ (representing the time between phase $\phi x$ and $\phi y$). By comparing the individual time intervals $\Delta td_{x-y}$ between phases (or channel outputs) $\phi1, \phi2, \phi3, \phi4, \phi5, \phi6, \phi7, \phi8$ the appropriate individual control signals Vctrl2, Vctrl3, Vctrl4, Vctrl5, Vctrl6, Vctrl7, Vctrl8 can be generated. For illustration purposes, the different individual control signals can be divided into different reference levels as they relate to their respective controlled channel outputs (or phases):

Reference level 5: $\phi1$ $\phi2$ $\phi3$ $\phi4$ $\phi5$ $\phi6$ $\phi7$ $\phi8$ Reference level 4: $\phi1$ $\phi3$ $\phi5$ $\phi7$ Reference level 3: $\phi1$ $\phi5$ Reference level 2: $\phi1$ Reference level 1: external reference clock For example, the first reference level is taken as the external reference clock signal. Once $\phi1$ is in lock with the reference clock, phase $\phi1$ operates as the second level of reference. For the third reference level, to generate individual control signal Vctrl5 associated with adjustment of phase $\phi5$, a comparison is made of the time interval ($\Delta td_{1-5}$) between $\phi1$ and $\phi5$ and the time interval ($\Delta td_{5-1+}$) between $\phi5$ and the subsequent $\phi1$ (represented by "$\phi1+$" in FIG. 5). For the fourth reference level, to generate individual control signal Vctrl3 associated with adjustment of phase $\phi3$, a comparison is made of the time interval ($\Delta td_{1-3}$) between $\phi1$ and $\phi3$ and the time interval ($\Delta td_{3-5}$) between $\phi3$ and $\phi5$. Also, as part of the fourth reference level, a comparison is made of the time interval ($\Delta td_{5-7}$) between $\phi3$ and $\phi5$ and the time interval ($\Delta td_{7-1+}$) between $\phi7$ and subsequent phase $\phi1$ to generate Vctrl7. The remaining individual control signals can be generated in like fashion for the fifth reference level: comparing $\Delta td_{1-2}$ and $\Delta td_{2-3}$ to generate Vctrl2; comparing $\Delta td_{3-4}$ and $\Delta td_{4-5}$ to generate Vctrl4; comparing $\Delta td_{5-6}$ and $\Delta td_{6-7}$ to generate Vctrl6; and comparing $\Delta td_{7-8}$ and $\Delta td_{8-1+}$ to generate Vctrl8.

Figure 6:
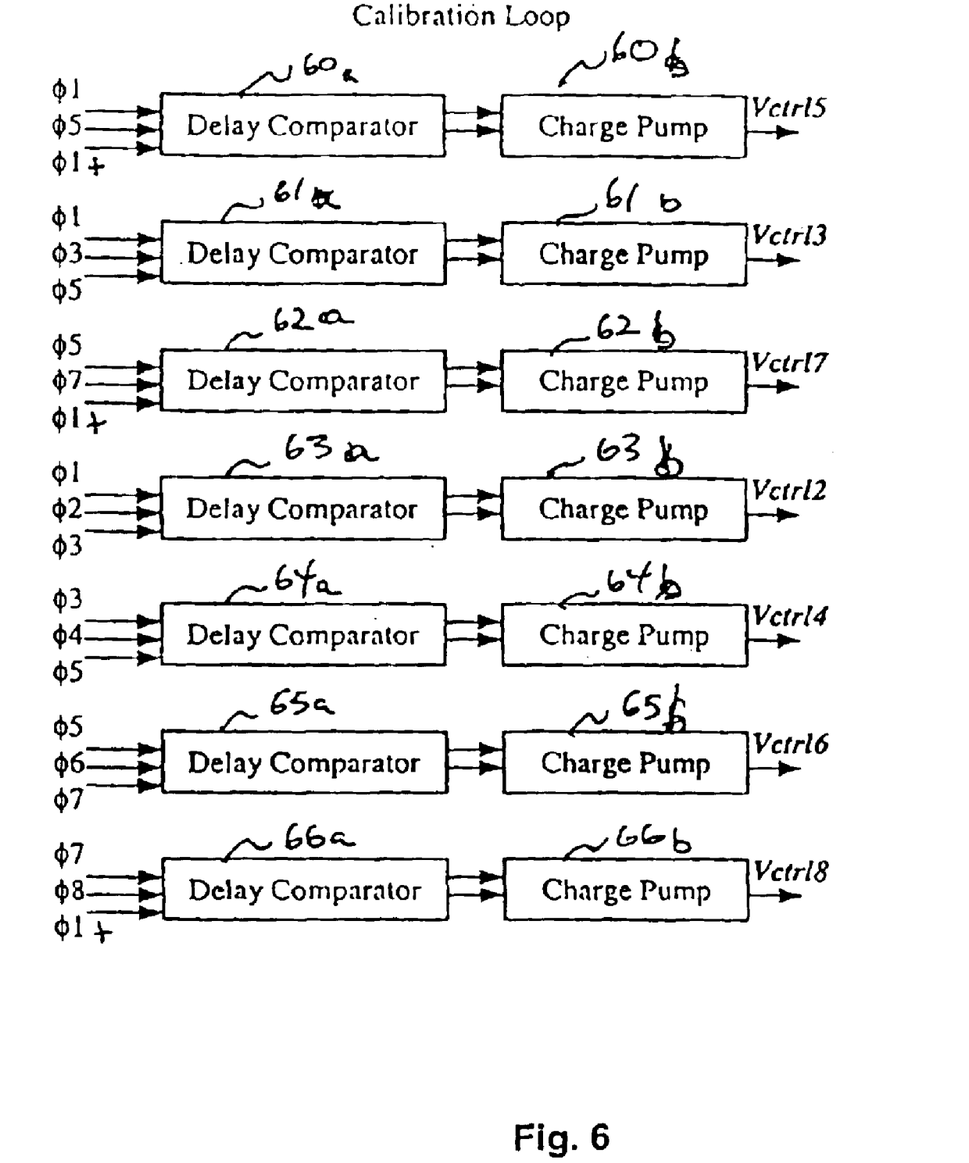
FIG. 6 is a block diagram illustrating calibration loops in accordance with a preferred embodiment of the invention.
Figure 7:
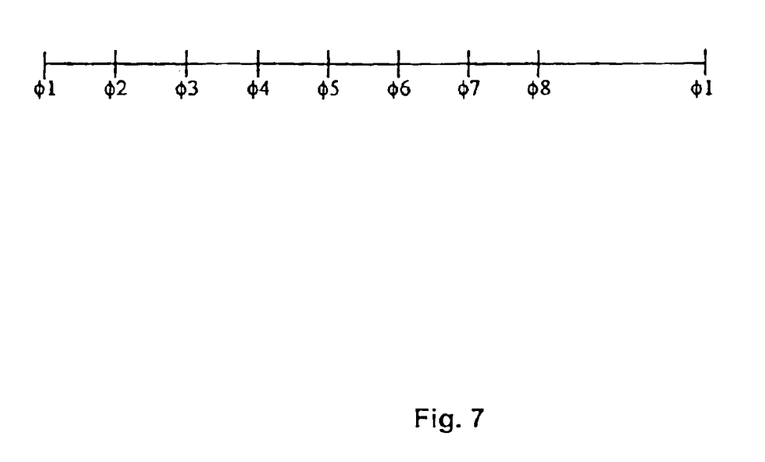
FIG. 7 is a timing diagram for a delay line architecture addressed in accordance with a preferred embodiment of the invention.

Utilizing these calibration loops, stability can be achieved at each level, without affecting the results of a previous level, with each calibration loop in lock. Preferably, these calibration loops are performed simultaneously using a variety of known mechanisms for performing the functionality described above. A series of delay comparators and charge pumps can be used, for example, to generate the individual control signals Vctrlx. As shown in FIG. 6, delay comparator 60a compares phases $\phi1, \phi5$, and $\phi1+$, and accordingly, generates a comparison signal(s) for input to charge pump 60b. Charge pump 60b converts the comparison signal(s) into a form used in the time-interleaved architecture as individual voltage control signal Vctrl5. Similarly, delay comparators 61a, 62a, 63a, 64a, 65a, 66a and charge pumps 61b, 62b, 63b, 64b, 65b, 66b are used to generate individual voltage control signals Vctrl3, Vctrl7, Vctrl2, Vctrl4, Vctrl6, and Vctrl8, respectively. To generate these individual control signals, comparison is made of phases $\phi1, \phi3, \phi5$ by delay comparator 61a; $\phi5, \phi7, \phi1+$ by delay comparator 62a; $\phi1, \phi2, \phi3$ by delay comparator 63a; $\phi3, \phi4, \phi5$ by delay comparator 64a; $\phi5, \phi6, \phi7$ by delay comparator 65a; and $\phi7, \phi8, \phi1+$ by delay comparator 66a, as shown in FIG. 6.

In accordance with a preferred embodiment, delay line 20 used in the DLL-based multi-phase clock generator system illustrated in FIG. 4 includes delay cells 22b, 22c, 22d that receive as their inputs channel output signals $\phi2, \phi3, \phi4, \phi5, \phi6, \phi7, \phi8$ directly from output buffers 26a, 26b, 26c, 27a, 27b, 27c. The multi-phase clock generator system shown in FIG. 4 can be used without this modification, i.e., with the delay cells 22b, 22c, 22d receiving delayed signals from previous delay cells, but will likely experience a delay offset in the distribution of phases $\phi1, \phi2, \phi3, \phi4, \phi5, \phi6, \phi7, \phi8$, as demonstrated in FIG. 7.

While preferred embodiments of the invention have been described and illustrated, it should be apparent that many modifications (e.g., structural, logical, etc.) to the embodiments and implementations of the invention can be made without departing from the spirit or scope of the invention. For example, while the exemplary embodiments disclosed herein depict the use of output buffers (e.g., output buffers 16a, 16b, ... 16n, FIG. 1), the invention can easily be implemented without the use of output buffers. The invention may be embodied in time-interleaved (or other) architecture both on a single device (e.g., integrated circuit), or in conjunction with one or more additional devices, for real-time or non-real-time operation.

The embodiments illustrated above referred to the use of the same (or substantially the same) delay cells (e.g., 12a, 12b, ... 12n, 14a, 14b, ... 14n, 15a, 15b, ... 15n) shown in FIG. 1, for example. It is likely, however, that any number or combination of different delay cells can be used in implementing the invention. Although the second set of delay cells (e.g., 14a, 14b, ... 14n, 15a, 15b, ... 15n) depicted in the exemplary embodiments described herein associate two second set delay cells (e.g., 14a, 15a) to every one first set delay cell (e.g., 12a), it should be apparent that any number (e.g., 0, 1, 2, 3, ... N) of second set delay cells may be associated with each one of the first set of delay cells (e.g., 12a, 12b, ... 12n).

The references to signaling parameters such as voltage control signals Vctrl, Vctrl1, ... Vctrlm, etc. (FIG. 1) or output current from charge pump 32 are for illustrative purposes only. Any known signaling parameters may be utilized in implementing the invention. While the series of individual control signals Vctrl1, Vctrli, ... Vctrlj, Vctrlk, Vctrl, ... Vctrlm are shown as useful in fine adjustment control in addition to a global control signal used by a device such as ring oscillator 10, it should be apparent that the series of individual control signals may also be used in lieu of the global control signal.

As used herein, the term "uniform time spacing" refers to the spacing between output signals themselves, as well as the spacing between transitions of one or another signal, or any other portion of the output signals. In practice, the output pulses may have different shapes due to device imperfections, etc. Thus, the uniform time spacing between output signals may best be achieved for the transitions of such signals. The term further includes the implementation of "substantially" uniform time spacing, which includes signals that may deviate slightly from the uniform spacing applied. Moreover, it should be understood that the term "uniform" time spacing may refer to identical time-wise spacing of output signals, as well as any other standard or set relationship between individual output signals. Some implementations of other "uniform" spacing may include, for example, specific relationships between one or all successive output signals (e.g., one time period being set at a rational fraction such as ⅗ or ⅞ of another time period, one time period being the sum/difference of several other time periods, etc.).

The modules described herein, particularly those illustrated in (or inherent from) FIGS. 1–7, may be one or more components in various combinations. Although the modules are shown or described as physically separated components (e.g., delay comparator 60a, charge pump 60b, FIG. 6), it should be readily apparent that individual modules may be omitted, combined, or further separated into a variety of different components, sharing different elements as required for the particular implementation of the embodiments disclosed herein. Accordingly, the invention is not limited by the description or drawings of this disclosure, but only by the appended claims.

What is claimed as new and desired to be protected by Letters Patent of the United States is:

1. A signaling device comprising:
    a signal generator generating a plurality of output signals at a plurality of respective time intervals, wherein said signal generator further comprises a second plurality of delay cells respectively generating the plurality of output signals;
    a plurality of time interval control units regulating the respective time intervals of the plurality of output signals, wherein said plurality of time interval control units individually control the respective time intervals between the plurality of output signals so as to produce substantially uniform time spacing between each of the plurality of output signals, wherein said plurality of time interval control units are a first plurality of delay cells used to delay respective ones of the plurality of output signals based on a plurality of individual control signals respectively received by the first plurality of delay cells;
    a plurality of output buffers respectively outputting a plurality of substantially uniformly time spaced channel signals; and
    a plurality of delay comparators, wherein each delay comparator receives predetermined ones of the plurality of channel signals output from said plurality of output buffers and produces respective ones of the individual controls signals received by the first plurality of delay cells.

2. The signaling device of claim 1, further comprising a plurality of charge pump units respectively coupled to said plurality of delay comparators, wherein each charge pump unit converts the individual control signals produced by said plurality of delay comparators into a compatible form used by the first plurality of delay cells.

3. A method of providing a plurality of clock signals, the method comprising the steps of:
    producing a series of delayed output signals; and
    outputting a series of channel output signals in response to respective ones of the series of delayed output signals; and
    individually controlling the output of each of the series of channel output signals to produce precise timing of each channel output signal output in said outputting step.

4. The method of providing a plurality of clock signal as recited in claim 3, wherein said individually controlling step involves individually controlling the output of each of the series of channel output signals to produce a series of uniformly spaced clock signals.

5. The method of providing a plurality of clock signals as recited in claim 3, wherein said individually controlling step aligns at least one of the channel output signals to a reference clock.

6. The method of providing a plurality of clock signals as recited in claim 5, wherein said individually controlling step aligns the at last one of the channel output signals to a reference clock using an output from a feedback loop comparing the at least one channel output signal and the reference clock signal.

7. The method of providing a plurality of clock signals as recited in claim 4, wherein said individually controlling step controls the output of a plurality of the series of channel output signals based on different channel output signals.

8. The method of providing a plurality of clock signals as recited in claim 7, wherein said individually controlling step controls the output of each of the series of channel output signals based on different combinations of channel output signals.

9. A time-interleaved architecture comprising:
    a first set of delay cells arranged in series, wherein each of said first set of delay cells produces a delayed output signal; and
    a second set of delay cells respectively coupled to ones of said first set of delay cells, said second set of delay cells receiving delayed output signals produced by respective ones of said first set of delay cells and respectively outputting channel output signals in response to the received delayed output signals;
    wherein each of said second set of delay cells receives a unique control signal controlling the timing of the channel output signal output by each of said second set of delay cells.

10. The time-interleaved architecture as recited in claim 9, wherein a plurality of the unique control signals received by said second set of delay cells are based on unique combinations of the channel output signals output by said second set of delay cells, and wherein the unique control signals individually control the timing of the channel output signals so as to produce substantially uniform time spacing between transitions of the channel output signals.

11. The time-interleaved architecture as recited in claim 10, wherein a designated one of the unique control signals received by said second set of delay cells is aligned to an external reference clock.

12. The time-interleaved architecture as recited in claim 11, wherein the designated one of the unique control signals is output from a feedback loop in response to a designated one of the channel output signals output by one of said second set of delay cells.

13. The time-interleaved architecture as recited in claim 9, wherein each of said first set of delays cells is associated with at least two delay cells of said second set of delay cells.

14. The time-interleaved architecture as recited in claim 9, further comprising a set of output buffers, wherein each of said set of output buffers is respectively coupled to one of the delay cells in said second set of delay cells to buffer the channel output signal output by the one delay cell in said second set of delay cells.

15. The time-interleaved architecture as recited in claim 14, wherein the time-interleaved architecture is within an integrated electronic system permitting real-time calibration of the channel output signals output by said second set of delay cells.

16. A multi-phase clock generator system for generating a plurality of channel output signals for use in a multi-channel application, the multi-phase clock generator comprising:

a phase detector receiving both a reference clock signal and a first channel output signal provided by a first channel of the multi-channel application, said phase detector outputting directional control signals based on a comparison of output phases of the reference clock signal and the first channel output signal so as to align the first channel output signal with the reference clock signal;

a charge pump providing an output in response to the directional control signals generated by said phase detector;

a loop filter providing a filtered main output control signal corresponding to the output provided by said charge pump;

a first plurality of delay cells;

a plurality of output buffers, wherein at least one output buffer is paired with a respective one of said first plurality of delay cells, said plurality of output buffers respectively providing a plurality of channel output signals, including the first channel output signal;

a second plurality of delay cells, each coupled between one of said first plurality of delay cells and a paired one of said plurality of output buffers, wherein each of said plurality of delay cells receives an individual delay control signal to control delay of the cell in providing an output signal to its associated output buffer; and a calibration loop, coupled to said second plurality of delay cells, wherein said calibration loop includes a plurality of delay comparators, each delay comparator respectively outputting individual delay control signals for respective ones of said second plurality of delay cells.

17. The multi-phase clock generator as recited in claim 16, wherein the individual delay control signal received by each of said second plurality of delay cells is distinct and independent of each other to allow independent control of the delay of each of said second plurality of delay cells.

18. The multi-phase clock generator as recited in claim 17, wherein said first plurality of delay cells form a ring oscillator.

19. The multi-phase clock generator as recited in claim 18, wherein said first plurality of delay cells form a delay line in a delay locked loop (DLL).

20. The multi-phase clock generator as recited in claim 19, wherein all but a reference one of said first plurality of delay cells receives as its input channel output signals from said plurality of output buffers, wherein the reference one of said first plurality of delay cells receiving as its input the reference clock signal.

21. The multi-phase clock generator as recited in claim 20, wherein each one of said plurality of delay comparators receiving as an input a different combination of the plurality of channel output signals output by said plurality of output buffers so as to provide simultaneous and independent control of the delay of each of said second plurality of delay cells.

22. A method of calibrating a plurality of channel output signals of a multi-phase clock generator having a first plurality of delay cells paired with at least one of a plurality of output buffers, and a second plurality of delay cells respectively receiving output signals from the first plurality of delay cells and outputting the channel output signals to respective ones of the plurality of output buffers, the method comprising the steps of:

phase aligning a first one of the plurality of channel output signals to an external reference clock; and individually controlling respective ones of the second plurality of delay cells to individually delay output of the channel output signals to respective ones of the plurality of output buffers.

23. The method of calibrating as recited in claim 22, wherein said individually controlling step comprises the step of comparing combinations of channel output signals from the plurality of output buffers to provide each individual control of each of the second plurality of delay cells.

24. The method of calibrating as recited in claim 23, wherein said individually controlling step further comprises the step of comparing unique combinations of channel output signals from the plurality of output buffers to provide distinct voltage control signals for all but one of the second plurality of delay cells.

25. A signaling device comprising:

a signal generator generating a plurality of output signals at a plurality of respective time intervals, wherein said signal generator further comprises a second plurality of delay cells respectively generating the plurality of output signals;

a plurality of time interval control units regulating the respective time intervals of the plurality of output signals, wherein said plurality of time interval control units individually control the respective time intervals between the plurality of output signals so as to produce substantially uniform time spacing between each of the plurality of output signals, wherein said plurality of time interval control units are a first plurality of delay cells used to delay respective ones of the plurality of output signals based on a plurality of individual control signals respectively received by the first plurality of delay cells;

a plurality of output buffers respectively outputting a plurality of substantially uniformly time spaced channel signals; and wherein said second plurality of delay cells are in a ring oscillator used in a phase locked loop (PLL):-based multi-phase clock generator system.

* * * * *

UNITED STATES PATENT AND TRADEMARK OFFICE
CERTIFICATE OF CORRECTION

PATENT NO.    : 6,768,356 B1
DATED         : July 27, 2004
INVENTOR(S)   : Lin Wu et al.

It is certified that error appears in the above-identified patent and that said Letters Patent is hereby corrected as shown below:

Column 7,
Line 63, the term "signal" should read -- signals --.

Signed and Sealed this

Thirtieth Day of November, 2004

JON W. DUDAS
*Director of the United States Patent and Trademark Office*